United States Patent
Zhou et al.

(10) Patent No.: US 9,627,549 B1
(45) Date of Patent: Apr. 18, 2017

(54) SEMICONDUCTOR TRANSISTOR DEVICE AND METHOD FOR FABRICATING THE SAME

(71) Applicant: UNITED MICROELECTRONICS CORP., Hsinchu (TW)

(72) Inventors: Zhi-Biao Zhou, Singapore (SG); Shao-Hui Wu, Singapore (SG); Chi-Fa Ku, Kaohsiung (TW); Chen-Bin Lin, Taipei (TW); Su Xing, Singapore (SG); Tien-Yu Hsieh, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 29 days.

(21) Appl. No.: 14/874,546

(22) Filed: Oct. 5, 2015

(51) Int. Cl.
  H01L 29/49 (2006.01)
  H01L 29/786 (2006.01)
  H01L 29/66 (2006.01)
  H01L 49/02 (2006.01)
  H01L 27/115 (2017.01)
  H01L 27/108 (2006.01)

(52) U.S. Cl.
  CPC ........ *H01L 29/7869* (2013.01); *H01L 27/108* (2013.01); *H01L 27/115* (2013.01); *H01L 28/40* (2013.01); *H01L 29/66742* (2013.01)

(58) Field of Classification Search
  CPC .... H01L 29/7869; H01L 28/40; H01L 27/108
  See application file for complete search history.

(56) References Cited

U.S. PATENT DOCUMENTS

| 7,282,782 | B2 | 10/2007 | Hoffman et al. |
| 7,453,087 | B2 | 11/2008 | Iwasaki |
| 2011/0133211 | A1* | 6/2011 | Malhan ............. H01L 29/66068 257/77 |
| 2013/0161606 | A1 | 6/2013 | Isobe et al. |

OTHER PUBLICATIONS

Shuhei Nagatsuka et al., "A 3bit/cell nonvolatile memory with crystalline In—Ga—Zn—O TFT," in Memory Workshop (IMW), 2013 5th IEEE International, pp. 188-191, May 26-29, 2013, doi: 10.1109/IMW.2013.6582131.

Takanori Matsuzaki et al., "1Mb Non-Volatile Random Access Memory Using Oxide Semiconductor," in Memory Workshop (IMW), 2011 3rd IEEE International, pp. 1-4, May 22-25, 2011, doi: 10.1109/IMW.2011.5873242.

* cited by examiner

*Primary Examiner* — Michael Shingleton
(74) *Attorney, Agent, or Firm* — WPAT, PC; Justin King

(57) ABSTRACT

A semiconductor transistor device includes an oxide semiconductor layer having an active surface, a source electrode, a drain electrode, a gate electrode and a control capacitor. The gate electrode, the source electrode and the drain electrode are directly in contact with the active surface. The gate electrode is disposed between the drain electrode and the source electrode. The gate electrode, the source electrode and the drain electrode are separated from each other. The control capacitor is electrically connected to the gate electrode through a connection.

9 Claims, 5 Drawing Sheets

SEMICONDUCTOR TRANSISTOR DEVICE AND METHOD FOR FABRICATING THE SAME

TECHNICAL FIELD

The invention relates in general to a semiconductor device and method for fabricating the same, and more particularly to a semiconductor transistor device and method for fabricating the same.

BACKGROUND

Field-effect transistors (FETs) are three-terminal devices each having a gate electrode, a source electrode, and a drain electrode. An FET is an electronically active device for switching a current between the source electrode and the drain electrode by applying a voltage to the gate electrode to control the current flowing in a channel layer. In particular, an FET having a channel layer of a thin film disposed on an insulating substrate of ceramics, glass, or plastic is called a thin-film transistor (TFT).

TFTs are fabricated by using thin-film technology and advantageously can be readily formed on a substrate having a relatively large area. With advances in manufacturing processes which enables miniaturization of such transistors device and ultra-low leakage performance, therefore, TFTs are widely used as driving devices for electronic devices, such as integrated circuits (ICs) and flat-panel displays (e.g. liquid-crystal displays).

However, there are still drawbacks concerning on the difficulty for filling gate oxide material into a gap disposed between the source electrode and the drain electrode as well as the problems of channel damage which may limit the device further scaling down, during the process for fabricating TFTs.

Therefore, there is a need of providing an improved semiconductor transistor device and method for fabricating the same to enable miniaturization thereof and obviate the drawbacks encountered from the prior art.

SUMMARY

According to one aspect of the present invention is to provide a semiconductor transistor device, wherein the semiconductor transistor device includes an oxide semiconductor layer having an active surface, a source electrode, a drain electrode, a gate electrode and a control capacitor. The gate electrode, the source electrode and the drain electrode are directly in contact with the active surface. The gate electrode is disposed between the drain electrode and the source electrode. The gate electrode, the source electrode and the drain electrode are separated from each other. The control capacitor is electrically connected to the gate electrode through a connection.

According to another aspect of the present invention, a method for fabricating a semiconductor transistor device is disclosed, wherein the method includes steps as follows: An oxide semiconductor layer having an active surface is formed. A source electrode, a drain electrode and a gate electrode separated from each other are formed directly in contact with the active surface, wherein the gate electrode is disposed between the drain electrode and the source electrode. A control capacitor electrically to connect to the gate electrode through a connection is formed.

In accordance with the aforementioned embodiments of the present invention, a semiconductor transistor device is provided, wherein a gate electrode, a source electrode, a drain electrode directly in contact with an oxide semiconductor layer are fabricated on a substrate by using thin-film technology; and a control capacitor electrically connected to the gate electrode through a connection is configured to provide the gate electrode a control voltage for turning on/off the semiconductor transistor device.

Because the gate electrode, the source electrode and the drain electrode of the semiconductor transistor device are directly in contact with the oxide semiconductor layer, and the switch of the semiconductor transistor device is controlled by the capacitance of the control capacitor rather than the charges trapped in the gate electrode. It is not necessary to form a gate oxide layer to fill the gap between the source electrode and the drain electrode, the problems of filling gate oxide material and channel damage thus can be avoid, and the semiconductor transistor device can be further scaled down by taking the advantages of the thin-film technology.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1A:
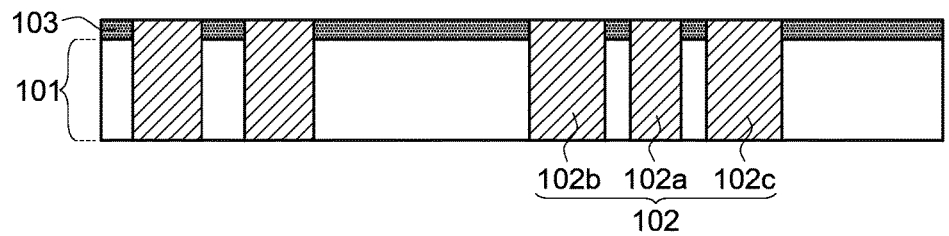
FIGS. 1A-1E are cross-sectional views illustrating the process for fabricating a semiconductor transistor device in accordance with one embodiment of the present invention.
Figure 1B:
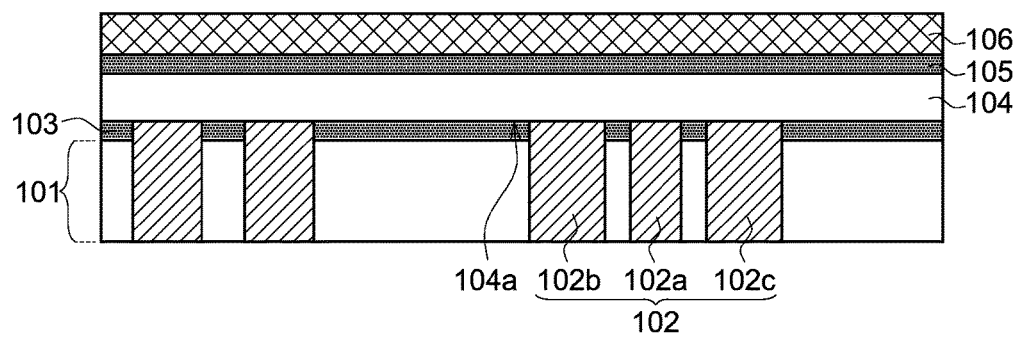

The embodiments as illustrated below provide a semiconductor transistor device and the method for fabricating the same to solve the problems of encountered from the prior art. The present invention will now be described more specifically with reference to the following embodiments and accompanying drawings illustrating the structure and method for fabricating the image sensor.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A-1E are cross-sectional views illustrating the process for fabricating a semiconductor transistor device 100 in accordance with one embodiment of the present invention. Firstly, a substrate 101 is provided and a gate electrode 102a, a source electrode 102b and a drain electrode 102c are formed on the substrate 101, wherein the gate electrode 102a is disposed between the source electrode 102b and the drain electrode 102c (see FIG. 1A).

In some embodiments of the present invention, the substrate 101 can be an inter-metal dielectric (IMD) layer; and the gate electrode 102a, the source electrode 102b and the drain electrode 102c may be formed by a patterned conductive layer 102, such as a patterned metal layer, a patterned indium tin oxide (ITO) layer or a patterned indium-zinc-oxide (IZO) layer. In the present embodiment, the gate electrode 102a, the source electrode 102b and the drain electrode 102c are formed by three separated portions of a patterned ITO layer and electrically insulated from each other by IMD material disposed on the substrate 101.

For purpose of protecting the gate electrode 102a, the source electrode 102b and the drain electrode 102c form being damaged by hydrogen of moisture coming from the outer circumstance, in some embodiments, a barrier material may be preferably formed on the substrate 101, and a planarization process, such as a chemical mechanism polish (CMP) process, using the patterned conductive layer 102 as a stop layer is then performed to form a barrier layer 103 and expose the top surfaces of the gate electrode 102a, the source electrode 102b and the drain electrode 102c. In some embodiments of the present embodiments the barrier layer 103 may include a material selected from a group consisting of aluminum oxides ($Al_2O_3$), hafnium oxides ($HfO_2$), tungsten dioxides ($WO_x$) and the arbitrary combinations thereof.

Next, an oxide semiconductor layer 104, another barrier layer 105 and a conductive layer 106 are sequentially formed on the barrier layer 103 and the exposed gate electrode 102a, the source electrode 102b and the drain electrode 102c. In the present embodiment, the oxide semiconductor layer 104 has an active surface 104a facing the substrate 101 (the barrier layer 103) and directly in contact with the gate electrode 102a, the source electrode 102b and the drain electrode 102c. The barrier layer 105 is formed on the surface of the oxide semiconductor layer 104 opposite to the active surface 104a. The conductive layer 106 is formed on the barrier layer 105 and separated from the oxide semiconductor layer 104 by the barrier layer 105 (see FIG. 1B).

The oxide semiconductor layer 104 may at least contain indium (In), zinc (Zn) and gallium (Ga). In addition, tin (Sn), Aluminum (Al), Hafnium (Hf), Zirconium (Zr) or the arbitrary combination thereof may be contained as a stabilizer. For example, in some embodiments of the present invention, the oxide semiconductor layer 104 can be made of an In—Ga—Zn-based oxide (In:Ga:Zn) material or an In—Sn-n-based oxide (In:Sn:Zn) material. In the present embodiment, the oxide semiconductor layer 104 can be an indium gallium oxide (IGZO) layer formed by a reactive solid-phase epitaxy (R-SPE) growth.

Since the process and materials for forming the barrier layer 105 is identical to that for forming the barrier layer 103, thus it will not redundantly described here. The conductive layer 106 can be made of metal (such as tungsten (W)), metallic compound (such as titanium nitride (TiN) or ITO), doped semiconductor (such as doped poly-silicon) or other suitable conductive material.

Figure 1C:
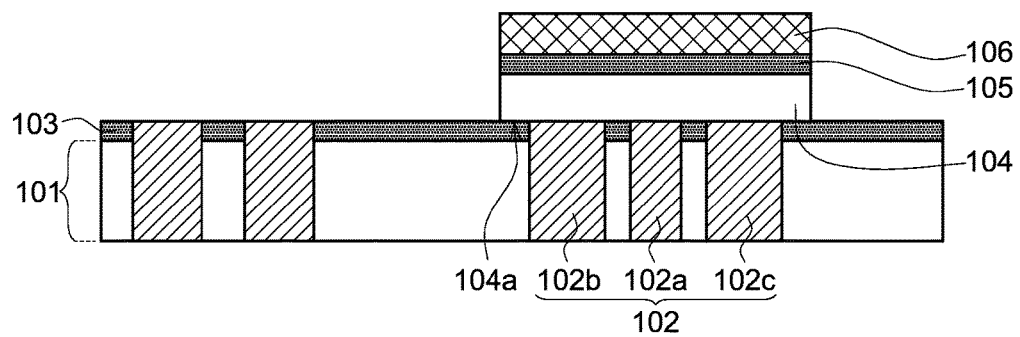

Subsequently, the oxide semiconductor layer 104, the barrier layer 105 and the conductive layer 106 are etched to remove a portion of the oxide semiconductor layer 104, the barrier layer 105 and the conductive layer 106, and remain the portion of the oxide semiconductor layer 104, the barrier layer 105 and the conductive layer 106 covering on the gate electrode 102a, the source electrode 102b and the drain electrode 102c (see FIG. 1C).

Figure 1D:
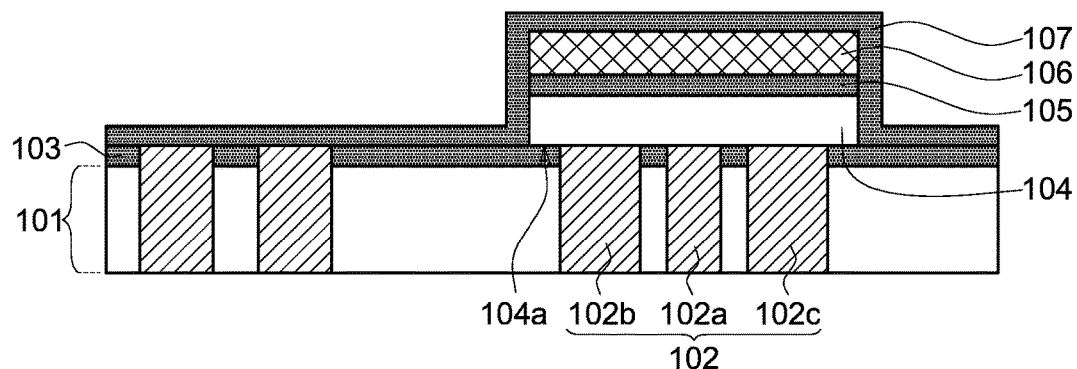

Yet another barrier layer 107 is formed on the substrate 101 to wrap the remained portion of the oxide semiconductor layer 104, the barrier layer 105 and the conductive layer 106 (see FIG. 1D). Since the process and materials for forming the barrier layer 107 is identical to that for forming the barrier layer 103, thus it will not redundantly described here.

Figure 1E:
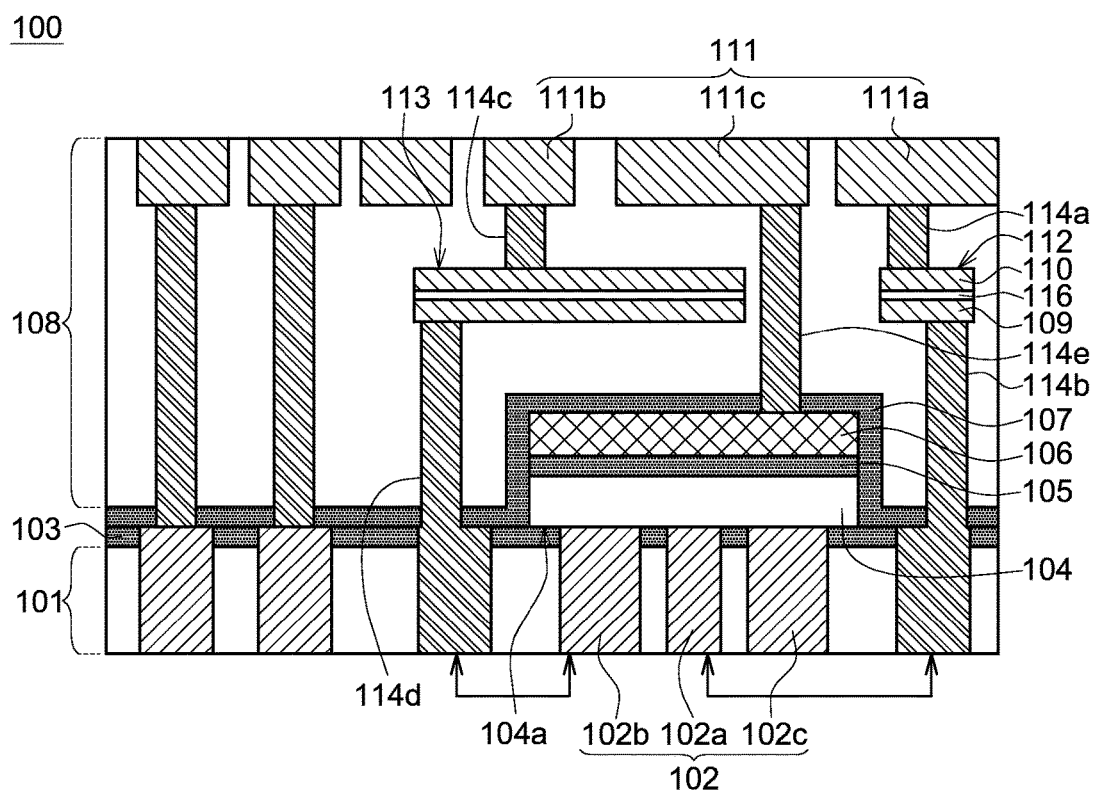

Thereafter, an inter-layer dielectric (ILD) layer 108, a plurality of patterned conductive layers, such as patterned metal layers 109, 110 and 111 and a plurality of via plugs are then formed on the barrier layer 107, whereby a plurality of capacitors, such as capacitors 112 and 113 as well as a plurality pads, such as 111a, 111b and 111c, are defined in the ILD layer 108; and the patterned metal layers 109, 110 and 111 that are used to constitute the capacitors 112 and 113 and the pads 111a, 111b and 111c are electrically connect to the conductive layer 106 as well as the patterned conductive layer 102 that is used to constitute the gate electrode 102a, the source electrode 102b and the drain electrode 102c through the via plugs (see FIG. 1E).

For example, in the present embodiment, the capacitors 112 and 113 are respectively defined by portions of the metal layers 109 and 110 formed in the ILD layer 108 and separated by a dielectric layer 116; and the portions of the metal layer 111 that are exposed from the top surface of the ILD layer 108a are designated as pads 111a, 111b and 111c. One end of the capacitors 112 made by a portion of the metal layer 110 is electrically connected to a pad 111a that can be coupled with an external circuit, such as a directive current (DC) circuit or a radio frequency (RF) circuit (not shown), through the via plug 114a, and the opposite side of the capacitors 112 made by a portion of the metal layer 109 is electrically connected to the portion of the patterned conductive layer 102 (shown as an arrow) that are defectively connect to the gate electrode 102a through the via plug 114b. One end of the capacitor 113 made by a portion of the metal layer 110 is electrically connected to the pad 111b that can be coupled with another external circuit (not shown), through the via plug 114c, and the opposite side of the capacitors 113 made by a portion of the metal layer 109 is electrically connected to the portion of the patterned conductive layer 102 (shown as an arrow) that are defectively connect to the source electrode 102b through the via plug 114d. The oxide semiconductor layer 104 is electrically connected to a pad 111c that can be coupled with yet another external circuit (not shown), through the via plug 114e.

After a series of back-end-of-line (BEOL) processes are performed, the semiconductor transistor device 100 as shown in FIG. 1E can be accomplished. In the present embodiment, the conductive layer 106 that is couple with an external circuit through the via plug 114e can serve as a top gat to provide a reference voltage to the oxide semiconductor layer 104, and the capacitor 112 that is coupled with another external circuit through the via plug 114a can serve as a control capacitor Cg to provide a control voltage to the gate electrode 102a for turning on/off the semiconductor transistor device 100.

In some embodiments of the present invention, the control voltage may be provided by a directive current (DC) circuit or a radio frequency (RF) circuit. In other words, the capacitor 112 can be coupled to a DC circuit or a RF circuit. In the present embodiment, the capacitor 112 preferably is coupled to a RF circuit.

Figure 2:
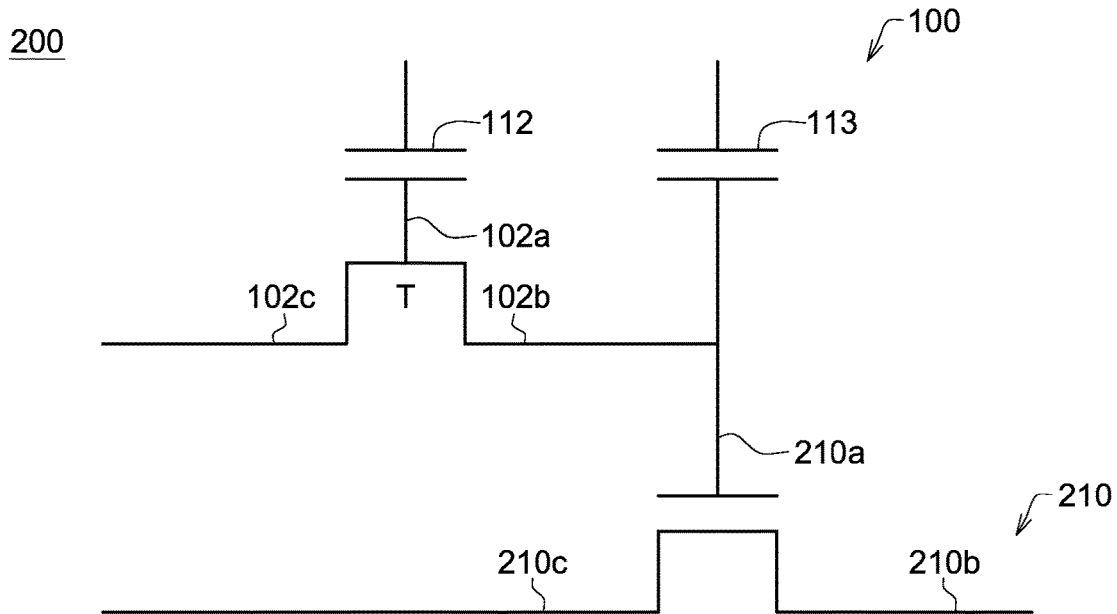
FIG. 2 is an equivalent-circuit diagram illustrating a nonvolatile oxide semiconductor random access memory (NOSRAM) cell applying the semiconductor transistor device depicted in FIG. 1E, in accordance with one embodiment of the present invention.

FIG. 2 is an equivalent-circuit diagram illustrating a NOSRAM cell 200 applying the semiconductor transistor device 100 depicted in FIG. 1E, in accordance with one embodiment of the present invention. In some embodiments of the present invention, the NOSRAM cell 200 is constituted by the semiconductor transistor device 100 and a selective switch 201. In the present embodiment, the selective switch 201 can be implemented by a metal-oxide-semiconductor (MOS) transistor. The gate electrode 201a of the selective switch 201 is electrically connected to the capacitor 113 and the source electrode 102b of the semiconductor transistor device 100; the source electrode 201b of the selective switch 201 is electrically connected to a select line SL; and the drain electrode 201c of the selective switch 201 is electrically connected to a bit line $BL_R$. The capacitor 112 serving as the control capacitor Cg and the capacitor 113 serving as the series capacitor Cs are respectively connected to word lines $WL_W$ and $WL_R$. The drain electrode 102c of the semiconductor transistor device 100 s electrically connected to another bit line $BL_W$.

Figure 3:
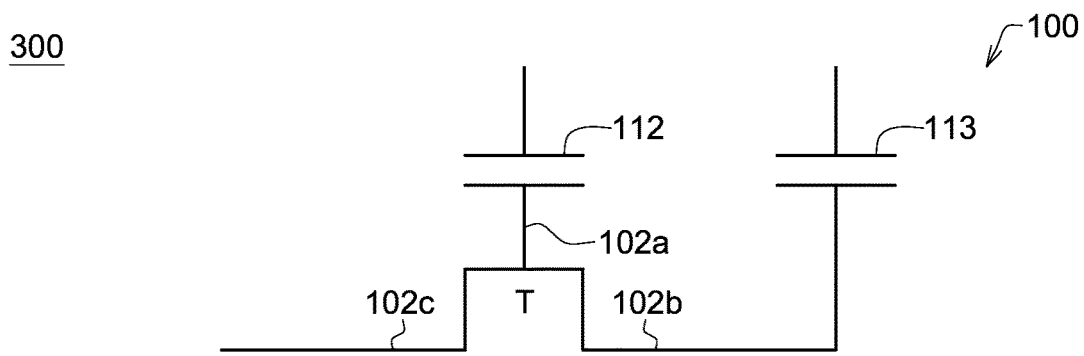
FIG. 3 is a circuit diagram illustrating a dynamic nonvolatile oxide semiconductor random access memory (DOSRAM) cell applying the semiconductor transistor device depicted in FIG. 1E, in accordance with another embodiment of the present invention.

FIG. 3 is a circuit diagrams illustrating a DOSRAM cell 300 applying the semiconductor transistor device 100 depicted in FIG. 1E, in accordance with another embodiment of the present invention. In the present embodiment, the semiconductor transistor device 100 can serves as a DOSRAM cell. For example, the capacitor 112 serving as the control capacitor Cg and the capacitor 113 serving as the series capacitor Cs are respectively connected to word lines $WL_W$ and $WL_R$. The drain electrode 102c of the semiconductor transistor device 100 s electrically connected to a bit line BL.

FIGS. 4A-4E are cross-sectional views illustrating the process for fabricating a semiconductor transistor device 400 in accordance with another embodiment of the present invention. Firstly, a substrate 401 is provided and a bottom gate 406a is formed on the substrate 401. In some embodiments of the present invention, the substrate 401 can be an IMD layer; and the bottom gate 406a by a portion of a patterned conductive layer 106. In some embodiments of the present invention, the patterned conductive layer 406 may made of metal (such as W), metallic compound (such as TiN or ITO), doped semiconductor (such as doped poly-silicon) or other suitable conductive material. In the present embodiment, the bottom gate 406a is formed by a portion of a patterned ITO layer formed on the substrate 401.

Figure 4A:
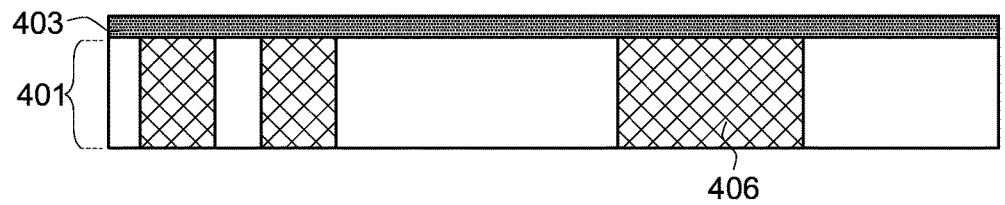
FIGS. 4A-4E are cross-sectional views illustrating the process for fabricating a semiconductor transistor device in accordance with another embodiment of the present invention.
Figure 4B:
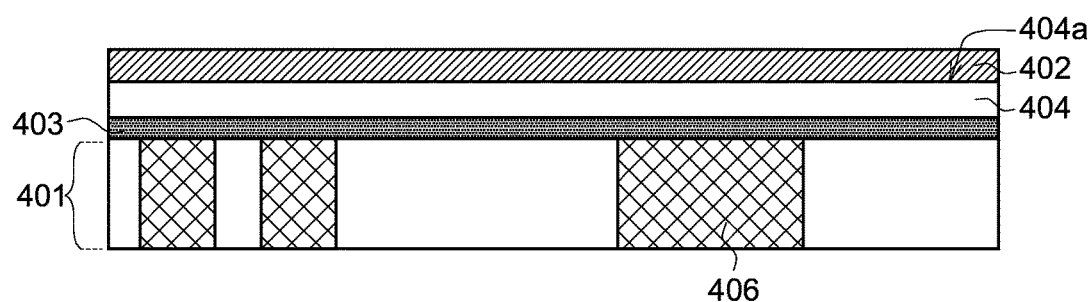

A barrier layer 403 is then formed on the substrate 401 to cover the patterned conductive layer 406 (see FIG. 4A). In some embodiments of the present embodiments the barrier layer 403 may include a material selected from a group consisting of $Al_2O_3$, $HfO_2$, $WO_x$, and the arbitrary combinations thereof.

Next, an oxide semiconductor layer 404 and a conductive layer 402 are sequentially formed on the barrier layer 403. In the present embodiment, the oxide semiconductor layer 104 has an active surface 404a departing from the substrate 101 (the barrier layer 403) and directly in contact with the conductive layer 402 (see FIG. 4B).

The oxide semiconductor layer 404 may at least contain In, Zn and Ga. In addition, Sn, Al, Hf, Zr or the arbitrary combination thereof may be contained as a stabilizer. For example, in some embodiments of the present invention, the oxide semiconductor layer 404 can be made of an In—Ga—Zn-based oxide (In:Ga:Zn) material or an In—Sn—Zn-based oxide (In:Sn:Zn) material. In the present embodiment, the oxide semiconductor layer 404 can be an IGZO layer formed by an R-SPE growth. The conductive layer 402 can be made of metal (such as Cu or Al), ITO or IZO.

Figure 4C:
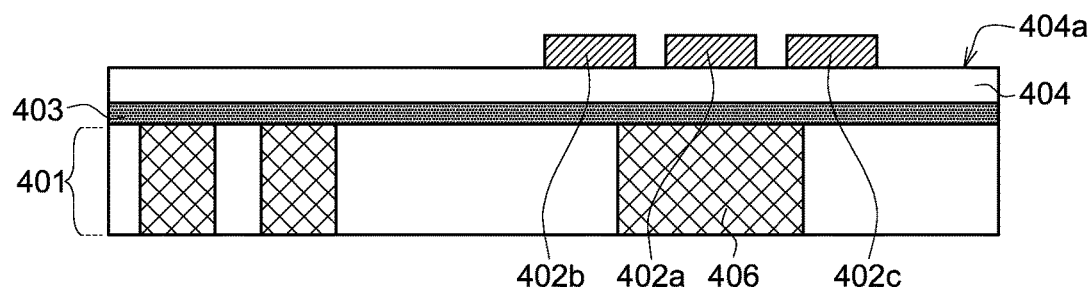
Figure 4D:
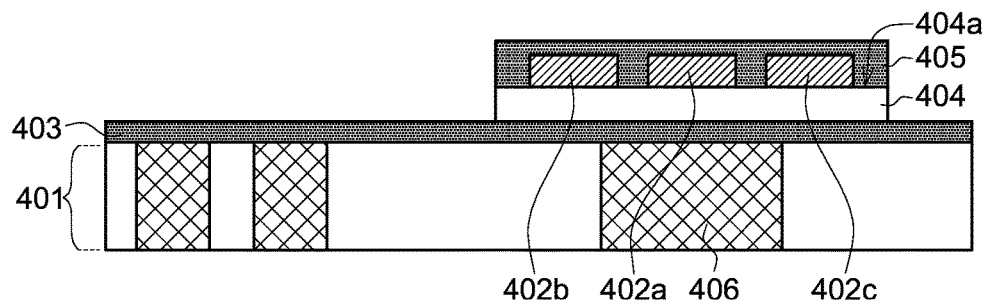

The conductive layer 402 is then patterned to form a gate electrode 402a, a source electrode 402b and a drain electrode 402c on the active surface 404a of the semiconductor layer 404, wherein the gate electrode 402a, the source electrode 402b and the drain electrode 402c separated from each other are directly in contact with the active surface 404a of the semiconductor layer 404, and the gate electrode 402a is disposed between the source electrode 402b and the drain electrode 402c (see FIG. 4C).

Subsequent, an etching process is performed to remove a portion of the oxide semiconductor layer 404 and to remain the portion of the oxide semiconductor layer 404 covering on the gate electrode 402a, the source electrode 402b and the drain electrode 402c. Another barrier layer 405 is then formed on the semiconductor layer 404 to wrap the gate electrode 402a, the source electrode 402b and the drain electrode 402c (see FIG. 4D). Since the process and materials for forming the barrier layer 405 is identical to that for forming the barrier layer 403, thus it will not redundantly described here.

Figure 4E:
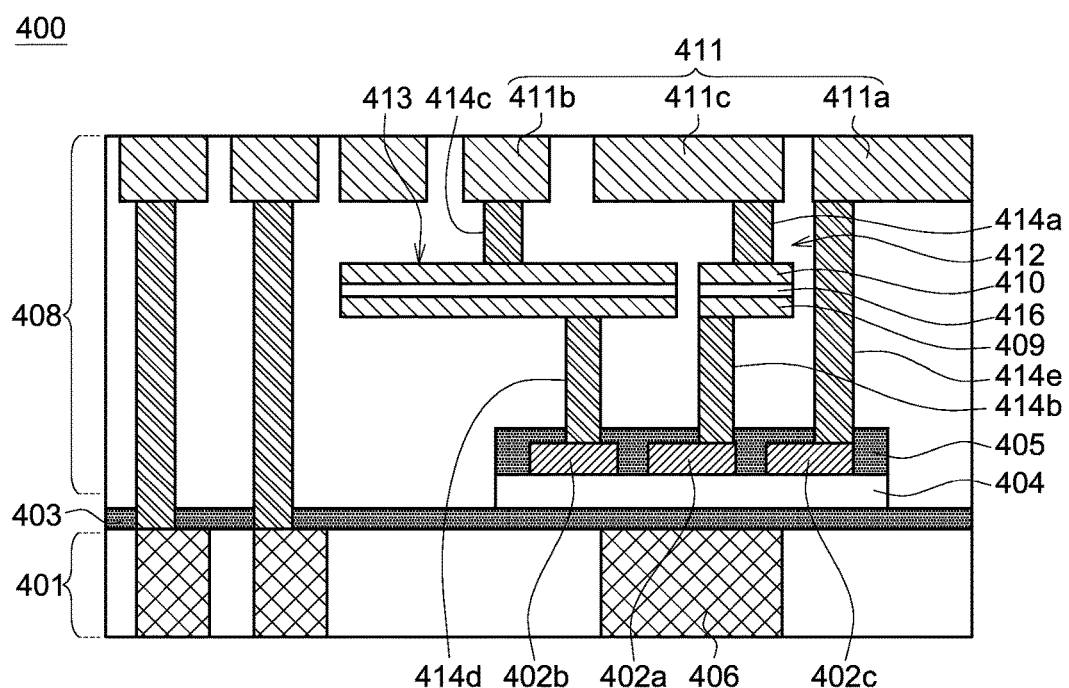

Thereafter, an ILD layer 408, a plurality of patterned conductive layers, such as patterned metal layers 409, 410 and 411 and a plurality of via plugs are then formed on the barrier layers 403 and 405, whereby a plurality of capacitors, such as capacitors 412 and 413 as well as a plurality pads, such as 411a, 411b and 411c, are defined in the ILD layer 408; and the patterned metal layers 409, 410 and 411 that are used to constitute the capacitors 412 and 413 and the pads 411a, 411b and 411c are electrically connect to the gate electrode 402a, the source electrode 402b and the drain electrode 402c as well as the patterned conductive layer 406 that is used to constitute the bottom gate 406a through the via plugs (see FIG. 4E).

For example, in the present embodiment, the capacitors 412 and 413 are respectively defined by portions of the metal layers 409 and 410 formed in the ILD layer 408 and separated by a dielectric layer 416; and the portions of the metal layer 411 that are exposed from the top surface of the ILD layer 408 are designated as pads 411a, 411b and 411c. One end of the capacitors 412 made by a portion of the metal layer 410 is electrically connected to the pad 411a that can be coupled with an external circuit, such as a DC circuit or a RF circuit (not shown), through the via plug 414a, and the opposite side of the capacitors 412 made by a portion of the metal layer 409 is electrically connected to the gate electrode 402a through the via plug 414b. One end of the capacitor 413 made by a portion of the metal layer 410 is electrically connected to the pad 411b that can be coupled with another external circuit (not shown), through the via plug 414c, and the opposite side of the capacitors 413 made by a portion of the metal layer 409 is electrically connected to the source electrode 402b through the via plug 414d. The drain electrode is electrically connected to the pad 411c that can be coupled with yet another external circuit (not shown), through the via plug 414e.

After a series of BEOL processes are performed, the semiconductor transistor device 400 as shown in FIG. 4E can be accomplished. In the present embodiment, the bottom 406 that is coupled with an external circuit through the via plug 414e can provide a reference voltage to the oxide semiconductor layer 404, and the capacitor 412 that is coupled with another external circuit through the via plug 414a can serve as a control capacitor Cg to provide a control voltage to the gate electrode 402a for turning on/off the semiconductor transistor device 400.

Similarly, the control voltage may be provided by a DC circuit or a RF circuit; and the application as shown in FIGS. 2 and 3 are also applicable to the semiconductor transistor device 400 as depicted in FIG. 4.

In accordance with the aforementioned embodiments of the present invention, a semiconductor transistor device is provided, wherein a gate electrode, a source electrode, a drain electrode directly in contact with an oxide semiconductor layer are fabricated on a substrate by using thin-film technology; and a control capacitor electrically connected to the gate electrode through a connection is configured to provide the gate electrode a control voltage for turning on/off the semiconductor transistor device.

Because the gate electrode, the source electrode and the drain electrode of the semiconductor transistor device are directly in contact with the oxide semiconductor layer, and the switch of the semiconductor transistor device is controlled by the capacitance of the control capacitor rather than the charges trapped in the gate electrode. It is not necessary to form a gate oxide layer to fill the gap between the source electrode and the drain electrode, the problems of filling gate oxide material and channel damage thus can be avoid, and the semiconductor transistor device can be further scaled down by taking the advantages of the thin-film technology.

It will be apparent to those skilled in the art that various modifications and variations can be made to the disclosed embodiments. It is intended that the specification and examples be considered as exemplary only, with a true scope of the invention being indicated by the following claims and their equivalents.

What is claimed is:

1. A semiconductor transistor device, comprising:
    an oxide semiconductor layer having a plane active surface;
    a source electrode directly in contact with the plane active surface;
    a drain electrode directly in contact with the plane active surface;
    a gate electrode directly in contact with the plane active surface, wherein the gate electrode is disposed between the drain electrode and the source electrode; and the gate electrode, the source electrode and the drain electrode are separated from each other; and
    a control capacitor electrically connected to the gate electrode through a connection.

2. The semiconductor transistor device according to claim 1, further comprising a conductive layer formed on one side of the oxide semiconductor layer opposite to the plane active surface and configured to provide a reference voltage to the oxide semiconductor layer.

3. The semiconductor transistor device according to claim 2, further comprising a barrier layer disposed between the conductive layer and the oxide semiconductor layer.

4. The semiconductor transistor device according to claim 3, wherein the barrier layer comprises a material selected from a group consisting of aluminum oxides ($Al_2O_3$), hafnium oxides ($HfO_2$), tungsten dioxides ($WO_x$) and arbitrary combinations thereof.

5. The semiconductor transistor device according to claim 2, further comprising a substrate, wherein the conductive layer, the oxide semiconductor layer are stacked on the substrate in sequence; and the plane active surface departs from the substrate.

6. The semiconductor transistor device according to claim 2, further comprising a substrate, wherein the plane active surface faces the substrate, and the conductive layer is disposed on the oxide semiconductor layer.

7. The semiconductor transistor device according to claim 1, wherein the control capacitor is connected to a directive current (DC) circuit or a radio frequency (RF) circuit.

8. The semiconductor transistor device according to claim 1, further comprising a selective switch and a capacitor element electrically connected to the source electrode to form a nonvolatile oxide semiconductor random access memory (NOSRAM).

9. The semiconductor transistor device according to claim 1, further comprising a capacitor element electrically connected to the source electrode to form a dynamic nonvolatile oxide semiconductor random access memory (DOSRAM).

* * * * *